(12) United States Patent  
Cherala et al.

(10) Patent No.: US 11,347,144 B2  
(45) Date of Patent: May 31, 2022

(54) OVERLAY IMPROVEMENT IN NANOIMPRINT LITHOGRAPHY

(71) Applicant: CANON KABUSHIKI KAISHA, Tokyo (JP)

(72) Inventors: Anshuman Cherala, Austin, TX (US); Mario Johannes Meissl, Austin, TX (US); Byung-Jin Choi, Austin, TX (US)

( * ) Notice: Subject to any disclaimer, the term of this patent is extended or adjusted under 35 U.S.C. 154(b) by 0 days.

(21) Appl. No.: 17/096,794

(22) Filed: Nov. 12, 2020

(65) Prior Publication Data

US 2021/0063870 A1 Mar. 4, 2021

Related U.S. Application Data

(62) Division of application No. 16/016,016, filed on Jun. 22, 2018, now Pat. No. 10,866,510.

(60) Provisional application No. 62/539,300, filed on Jul. 31, 2017.

(51) Int. Cl.
*G03F 7/00* (2006.01)
*G03F 9/00* (2006.01)

(52) U.S. Cl.
CPC .......... *G03F 7/0002* (2013.01); *G03F 9/7042* (2013.01)

(58) Field of Classification Search
CPC .................................................. G03F 7/0002
See application file for complete search history.

(56) References Cited

U.S. PATENT DOCUMENTS

| 6,873,087 B1 * | 3/2005 | Choi | B82Y 10/00 310/323.17 |
| 7,186,483 B2 * | 3/2007 | Sreenivasan | B29C 37/005 430/22 |
| 7,229,273 B2 * | 6/2007 | Bailey | B82Y 40/00 425/385 |
| 2009/0140445 A1 * | 6/2009 | Lu | B29C 43/021 264/40.1 |

* cited by examiner

*Primary Examiner* — Nathan T Leong
(74) *Attorney, Agent, or Firm* — Canon U.S.A., Inc., IP Division

(57) ABSTRACT

Reducing an overlay error in nanoimprint lithography includes forming an imprinted substrate having pairs of corresponding peripheral overlay marks and corresponding central overlay marks on the imprinted substrate. An in-plane overlay error is assessed based on relative positions of corresponding central overlay marks, and a combined overlay error is assessed based on relative positions of corresponding peripheral overlay marks. A difference between the combined overlay error and the in-plane overlay error is assessed to yield an adjusted overlay error for each pair of corresponding peripheral overlay marks. The adjusted overlay error for each pair of corresponding peripheral overlay marks is compared with overlay errors associated with known out-of-plane orientation parameters of the template with respect to the substrate, and corrected out-of-plane orientation parameters are selected to reduce an expected out-of-plane overlay error of a subsequent imprinted substrate associated with out-of-plane orientation parameters of the template with respect to the substrate.

2 Claims, 12 Drawing Sheets

OVERLAY IMPROVEMENT IN NANOIMPRINT LITHOGRAPHY

CROSS-REFERENCE TO RELATED APPLICATION

This application is a Divisional of U.S. application Ser. No. 16/016,016, filed Jun. 22, 2018, which claims the benefit of U.S. Patent Application No. 62/539,300 entitled "OVERLAY IMPROVEMENT IN NANOIMPRINT LITHOGRAPHY" and filed Jul. 31, 2017, which is incorporated by reference herein in its entirety.

TECHNICAL FIELD

This invention relates to reducing overlay errors in nanoimprint lithography.

BACKGROUND

Alignment errors in nanoimprint lithography are generally understood to be misalignments between alignment marks of a template and corresponding alignment marks of a substrate. Alignment errors can be corrected in real time during an imprinting process by a feedback scheme in which an orientation of the template is adjusted with respect to an orientation of the substrate. Overlay errors in nanoimprint lithography are generally understood to be misalignments between overlay marks of a polymeric layer formed by a template and overlay marks on the substrate. Overlay errors are detected in the imprinted substrate, and therefore cannot be corrected in real time. During a nanoimprint lithography process, field corners on the substrate and corners of the imprint lithography template tend to deform due at least in part to the force exerted on the substrate by the template during imprinting. This out-of-plane deformation contributes to poor overlay of the imprinted substrate and can result in low device yields.

SUMMARY

In a first general aspect, reducing an overlay error of an imprinted substrate in a nanoimprint lithography process includes disposing an imprint resist on a first substrate and contacting the imprint resist with a template having initial in-plane and out-of-plane orientation parameters with respect to the first substrate. The template includes peripheral overlay marks in a peripheral region of the template and central overlay marks in a central region of the template. The substrate includes peripheral overlay marks that correspond to the peripheral overlay marks of the template and central overlay marks that correspond to the central overlay marks of the template. The initial out-of-plane orientation parameters include an initial tilt angle of the template with respect to the first substrate and an initial distance between the template and the first substrate. The imprint resist is polymerized to yield a polymeric layer in contact with the template, thereby transferring the peripheral overlay marks and the central overlay marks of the template to the polymeric layer. The template is separated from the polymeric layer to yield a first imprinted substrate including pairs of corresponding peripheral overlay marks on the polymeric layer and the first substrate and pairs of corresponding central overlay marks on the polymeric layer and the first substrate. An in-plane overlay error of the first imprinted substrate is assessed based on relative positions of each central overlay mark of the polymeric layer and each corresponding central overlay mark of the first substrate. A combined overlay error of the first imprinted substrate is assessed based on relative positions of each peripheral overlay mark of the polymeric layer and each corresponding peripheral overlay mark of the first substrate. The combined overlay error comprises the in-plane overlay error and an out-of-plane overlay error of the first imprinted substrate, where "out-of-plane overlay error" refers to overlay error due to or associated with out-of-plane orientation parameters of the template with respect to the substrate. A difference between the combined overlay error and the in-plane overlay error is assessed to yield an adjusted overlay error for each pair of corresponding peripheral overlay marks, and the adjusted overlay error for each pair of corresponding peripheral overlay marks is compared with overlay errors associated with known out-of-plane orientation parameters of the template with respect to the first substrate. Corrected out-of-plane orientation parameters of the template with respect to the first substrate are selected to reduce an expected out-of-plane overlay error of a second imprinted substrate. The corrected out-of-plane orientation parameters include at least one of a corrected tilt angle of the template with respect to the first substrate and a corrected distance between the template and the first substrate.

In a second general aspect, manufacturing an article includes the first general aspect, followed by orienting the template with respect to a second substrate based on the corrected out-of-plane orientation parameters and forming a second imprinted substrate to yield the article. Orienting the template with respect to the second substrate includes at least one of adjusting the tilt angle of the template to the corrected tilt angle and adjusting the distance between the template and the second substrate to the corrected distance.

Implementations of the first and second general aspects may include one or more of the following features.

In some implementations, the template is oriented with respect to a second substrate based on the corrected out-of-plane orientation parameters. Orienting the template with respect to the second substrate may include at least one of adjusting the tilt angle of the template to the corrected tilt angle and adjusting the distance between the template and the second substrate to the corrected distance.

In some implementations, the first substrate includes a first multiplicity of fields, and the first and second general aspects further include repeating the first general aspect for each field of the first substrate to generate corrected out-of-plane orientation parameters for each field of the first substrate. The second substrate may include a second multiplicity of fields, each field in the second multiplicity of fields corresponding to a field in the first multiplicity of fields, and the first and second general aspects may further include applying the corrected out-of-plane orientation parameters for each field of the first substrate to each corresponding field of the second substrate.

The overlay error for each pair of corresponding central overlay marks may be compared with overlay errors associated with known in-plane orientation parameters of the template with respect to the first substrate, and corrected in-plane orientation parameters of the template with respect to the first substrate may be selected to reduce an expected in-plane overlay error of the second imprinted substrate. The template may be oriented with respect to the second substrate based on the corrected in-plane orientation parameters. Orienting the template with respect to the second substrate typically includes at least one of translating the template or the second substrate in the plane of the template or the second substrate, respectively; rotating the template or the second substrate in the plane of the template or the second substrate, respectively; and increasing or decreasing a compression force to opposite sides of the template.

In some implementations, the template includes central alignment marks in the central region of the template and the first substrate includes central alignment marks that correspond to the central alignment marks of the template. After contacting the imprint resist with the template and before polymerizing the imprint resist, each central alignment mark of the template may be located with respect to each corresponding central alignment mark of the substrate, an in-plane alignment error of the template may be assessed based on relative positions of each central alignment mark of the template and each corresponding central alignment mark of the substrate, and a relative position of the template and the first substrate may be adjusted to reduce the in-plane alignment error of the template. Adjusting the relative position of the template and the first substrate may include at least one of translating the template or the first substrate in the plane of the template or the first substrate, respectively; rotating the template or the first substrate in the plane of the template or the first substrate, respectively; and increasing or decreasing a compression force to opposite sides of the template.

In a third general aspect, an imprint lithography system for reducing an overlay error of an imprinted substrate includes a template chuck configured to retain a template, a substrate chuck configured to retain a substrate, an imprint head configured to adjust a position of the template chuck relative to a position of the substrate chuck, and a controller in communication with the imprint head. The controller is configured to assess an in-plane overlay error of an imprinted substrate based on relative positions of corresponding central overlay marks in a central region of the imprinted substrate and assess a combined overlay error of the imprinted substrate based on relative positions of corresponding peripheral overlay marks in a peripheral region of the imprinted substrate. The combined overlay error typically includes in-plane and out-of-plane overlay error. The controller is further configured to assess a difference between the combined overlay error and the in-plane overlay error to yield an adjusted overlay error for each pair of corresponding peripheral overlay marks. The adjusted overlay error for each pair of corresponding peripheral overlay marks may be due at least in part to an out-of-plane alignment error in the peripheral region of the template, where "out-of-plane alignment error" refers to an alignment error due to or associated with out-of-plane orientation parameters of the template with respect to the substrate. The controller is further configured to compare the adjusted overlay error for each pair of corresponding peripheral overlay marks with overlay errors associated with known out-of-plane orientation parameters of the template with respect to the substrate and select corrected out-of-plane orientation parameters of the template with respect to the substrate to reduce an expected overlay error of a second imprinted substrate. The corrected out-of-plane orientation parameters typically include a corrected tilt angle of the template with respect to the substrate and a corrected distance between the template and the substrate. The controller is further configured to provide a signal to the imprint head to adjust an orientation of a template in the template chuck relative to an orientation of a substrate in the substrate chuck to implement the corrected out-of-plane orientation parameters.

Implementations of the third general aspect may include one or more of the following features.

The controller may be configured to provide the signal to the imprint head to tilt the template about an axis in the plane of the template. The controller may be configured to provide the signal to the imprint head to increase or decrease a distance between the substrate and the template. In some cases, the controller is configured to compare an overlay error for pairs of corresponding central overlay marks with overlay errors associated with known in-plane orientation parameters of the template with respect to the substrate and select corrected in-plane orientation parameters of the template with respect to the first substrate to reduce an expected in-plane overlay error of a second imprinted substrate. The controller may be configured to orient the template with respect to the second substrate based on the corrected in-plane orientation parameters.

In some implementations, the controller is configured to locate central alignment marks in a central region of the template and corresponding central alignment marks in a central region of the substrate, assess an in-plane alignment error of the template based on relative positions of corresponding central alignment marks, and adjust a relative position of the template and the substrate to reduce an in-plane alignment error of the template.

In a fourth general aspect, an imprint lithography template includes central overlay marks on a surface of the template in a central region of the template and peripheral overlay marks on the surface of the template in a peripheral region of the template. The central overlay marks define corners of a polygon, and each peripheral overlay mark is positioned proximate a corner of the template or a boundary of the template imprinting area.

Implementations of the fourth general aspect may include one or more of the following features.

The template may include central alignment marks on the surface of the template in the central region of the template. Each central alignment mark may be proximate a central overlay mark. The central alignment marks may define corners of a quadrilateral, such as a rectangle or a parallelogram.

In a fifth general aspect, controlling a tilt of an imprint head or a force applied by the imprint head is based on a detection result of marks at least in a peripheral region of the substrate and the template or in the peripheral region of the substrate and the imprinted layer.

Implementations of the fifth general aspect may include one or more of the following implementations.

Controlling the tilt of the imprint head or the force applied by the imprint head may be based on an out-of-plane component being distinguished by performing a process to distinguish the in-plane component and the out-of-plane component with respect to the detection result of the marks in the peripheral region. The process to distinguish the in-plane component and the out-plane component may be performed with respect to the detection result of the marks in the peripheral region.

In a sixth general aspect, controlling the movement of alignment is distinguished by performing a process to distinguish an in-plane component and an out-of-plane component with respect to a detection result of marks at least in the peripheral region of the substrate and the template or in the peripheral region of the substrate and the imprinted layer.

Advantages of the general aspects and implementations described herein include reduced overlay error and higher device yields. A feedforward process based on overlay errors does not require "through the mask" (TTM) assessment of alignment errors. A hybrid scheme including a feedforward process based on overlay errors and a feedback process including adjustment of alignment errors in real time during the imprinting process may be more easily implemented than a real-time process that requires detection of alignment errors for more than four pairs of alignment marks.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
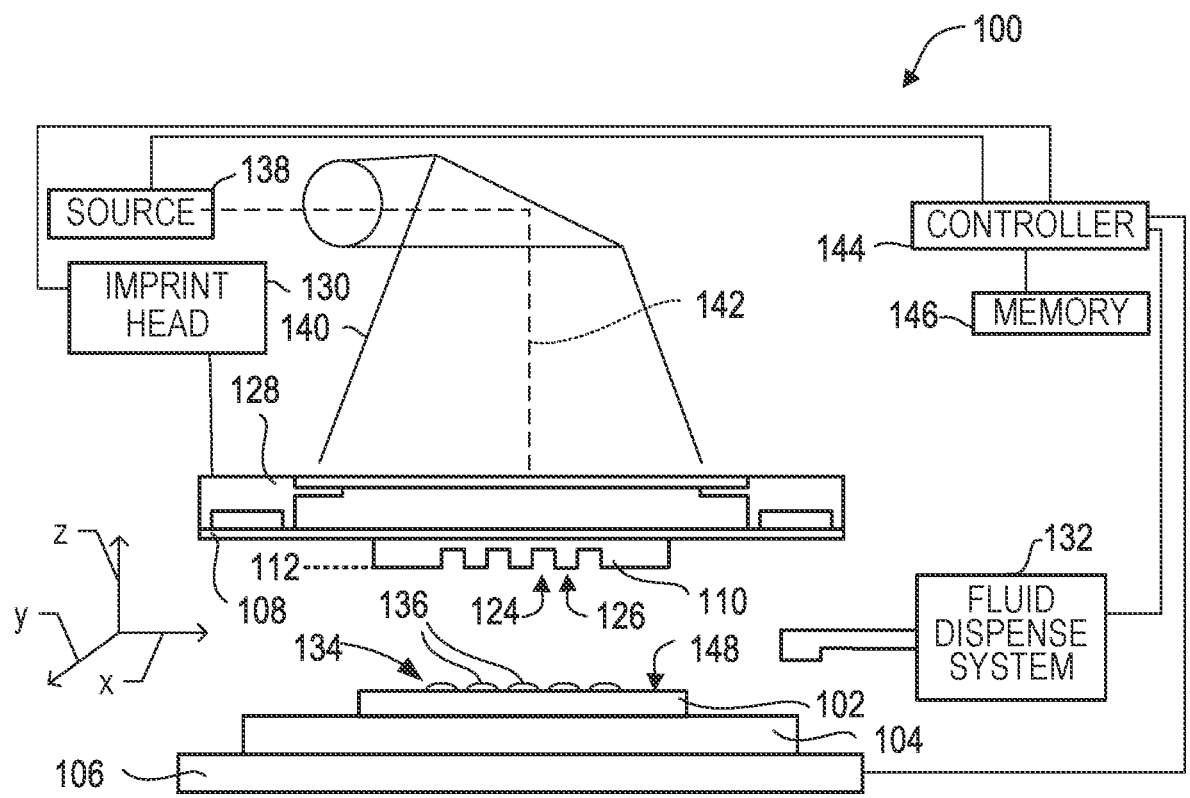
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is incorporated by reference herein. The substrate 102 and the substrate chuck 104 may be further supported by a stage 106. The stage 106 provides motion about the x-, y-, and z-axes. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 122 includes a plurality of features defined by spaced-apart recesses 124 and protrusions 126. However, in some examples, other configurations of features are possible. The patterning surface 112 may define any pattern that forms the basis of a pattern to be formed on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. Further, the template chuck 128 may be coupled to an imprint head 130 such that the template chuck 128, the imprint head 130, or both are configured to facilitate movement of the template 118. Movement of the template 118 includes movement in the plane of the template (in-plane movement) and movement out of the plane of the template (out-of-plane movement) with respect to the template. In-plane movement includes translation of the template 118 in the plane of the template (e.g., in the X-Y plane as depicted in FIG. 1) and rotation of the template in the plane of the template (e.g., in the X-Y plane and about the Z axis). Translation or rotation of the template 118 with respect to the substrate 102 may also be achieved by translation or rotation of the substrate. In-plane movement of the template 118 also includes increasing or decreasing a compression force on opposite sides of the template (e.g., with a magnification actuator) to increase or decrease dimensions of the template in the X-Y plane of the template. Out-of-plane movement of the template 118 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 118 about an axis in the X-Y plane of the template changes an angle between the X-Y plane of the template 118 and the X-Y plane of substrate 102, and is referred herein to as "tilting" the template with respect to the substrate, or changing a "tilt" or "tilt angle" of the template with respect to the substrate.

U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
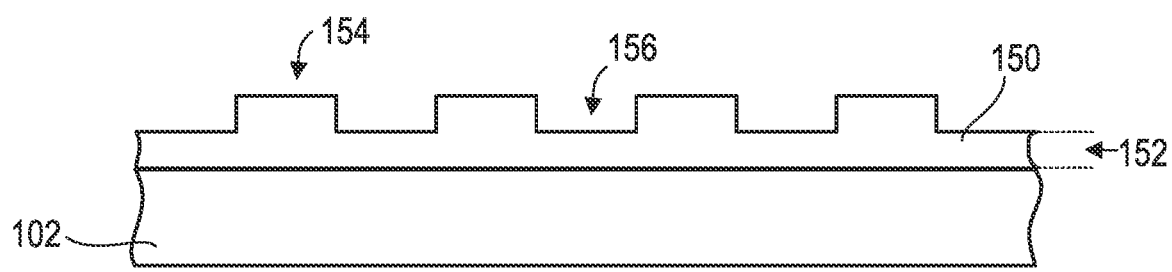
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 110 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 122, defining a polymeric patterned layer 150 on the substrate 102. In some examples, the patterned layer 150 includes a residual layer 152 and a plurality of features shown as protrusions 154 and recessions 156, with the protrusions 154 having a thickness $t_1$ and the residual layer 152 having a thickness $t_2$.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mask" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, which are incorporated by reference herein. Alignment errors may be caused by relative positioning of the substrate and the template, deformation of the substrate or the template, or a combination thereof.

In-plane alignment error may be caused by placement error, rotation error, magnification error, skew error, template distortion error, or any combination thereof. Placement error generally refers to X-Y positioning errors between a template and substrate (that is, translation along the X axis, the Y axis, or both, where the X and Y axes are in the plane of or parallel to the imprinting surface of the template or the substrate, as depicted in FIG. 1). Rotation (or theta) error generally refers to the relative orientation error about the Z axis (that is, rotation about the Z axis, where the Z axis is orthogonal to the X-Y plane as depicted in FIG. 1).

Magnification error generally refers to thermal, optical, or material induced shrinkage or expansion of the imprinted area as compared to the original patterned area on the template. Skew error generally refers to a skewing of the template with respect to the substrate, such that sides of the template are not orthogonal. Template distortion error generally includes magnification of a first portion of a template relative to a second portion of a template, such that the template has a trapezoidal or higher order polygonal distortion with respect to the substrate.

Placement errors in which a template alignment mark and a corresponding substrate alignment mark are offset in the X-Y plane may be compensated for by relative movement of the template and the substrate (e.g., by controlled movement of the substrate, the template, or both in the X-Y plane). Rotation errors may be compensated for by altering the relative angle of the template and substrate in the X-Y plane (e.g., by rotation of the substrate, the template, or both). Magnification errors and template distortion errors may be compensated for by altering the physical dimensions of the template in the X-Y plane (e.g., by increasing or decreasing a compression force to opposite sides of the template).

Figure 3:
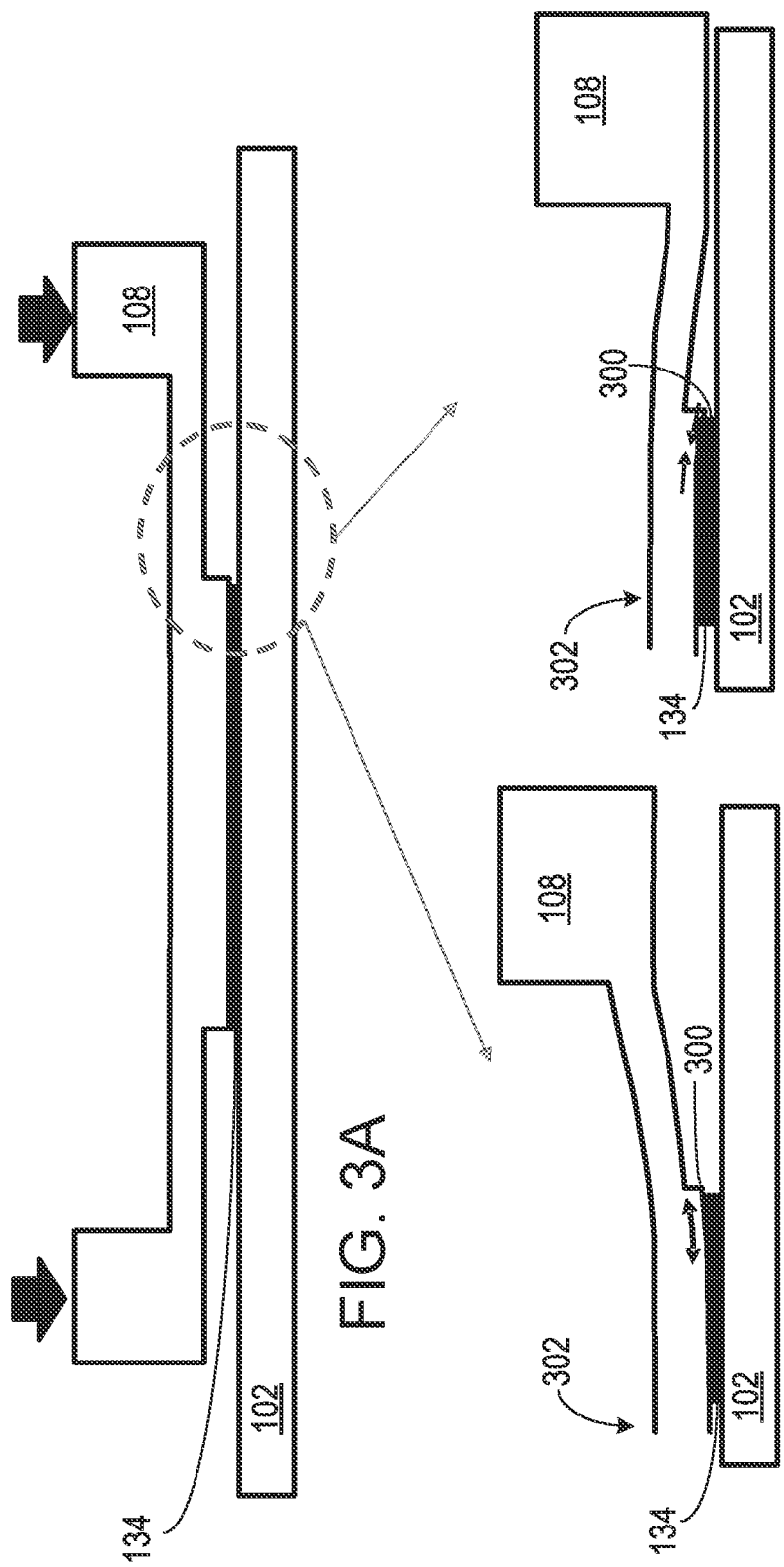
FIG. 3A depicts a side view of a nanoimprint lithography template in contact with a polymerizable material on a substrate.
FIGS. 3B and 3C depict out-of-plane deformation of a corner of the nanoimprint lithography template due to force exerted on the substrate by the template.

Out-of-plane alignment errors may be caused by force errors and "tilt" errors that are manifested as a result of bending of the template. Force errors may be understood with respect to FIGS. 3A-3C. FIG. 3A depicts template 108 in contact with polymerizable material 134 on substrate 102. The vertical arrows indicate a force on the template from the imprint head. When the force is too low on a corner 300 of the template 108, the template bends such that the distance between the surface of the template and the surface of the substrate 102 is greater than the distance at a central region 302 of the template, as depicted in FIG. 3B. When the force is too high on a corner 300 of the template 108, the template bends such that the distance between the surface of the template and the surface of the substrate 102 is less than the distance at a central region 302 of the template, as depicted in FIG. 3C.

For a 1.1 mm thick fused silica template with 64 mm D coreout, a 1 N imprint force typically causes alignment marks in a peripheral region (e.g., a corners) of the template to deform about 10 nm. Increasing or decreasing the force exerted on the substrate by the template may be accomplished by decreasing or increasing a distance between the substrate and the template, respectively, by movement of the template via the imprint head along the Z axis.

Figure 4:
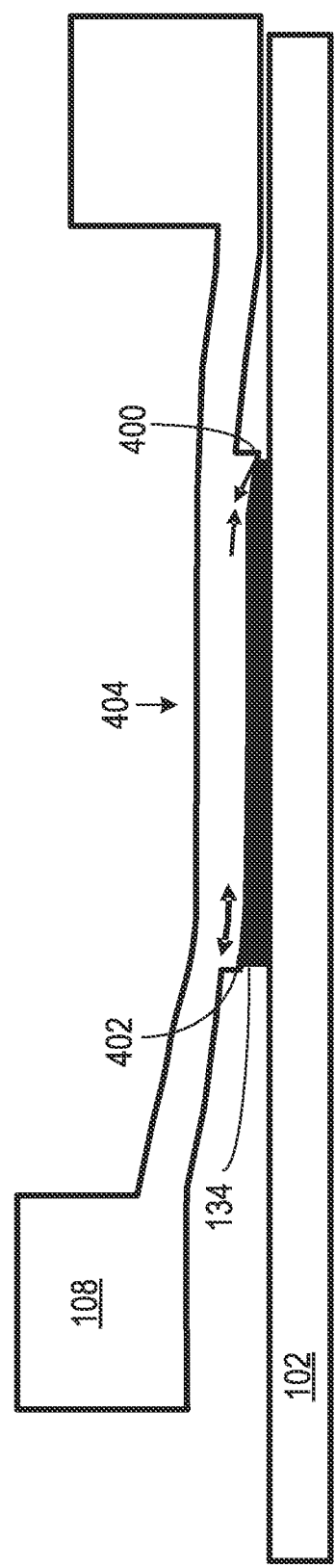
FIG. 4 depicts a side view of a nanoimprint lithography template in contact with a polymerizable material on a substrate, with out-of-plane deformation of the template due to a tilt of the template with respect to the substrate.

"Tilt" errors generally refer to bending of the template in a peripheral region (e.g., a corner) due at least in part to rotation of the template about an axis in the X-Y plane of the template. FIG. 4 depicts template 108 in contact with polymerizable material 134 on substrate 102, with the template rotated or "tilted" toward substrate 102 at corner 400. When template 108 is rotated (or "tilted") about an axis in the X-Y plane of the template, the template bends at corners 400 and 402. As depicted in FIG. 4, the distance between corner 400 and substrate 102 is less than the distance between the template 108 and the substrate 102 at a central region 404 of the template, and the distance between corner 402 and the substrate is greater than the distance between the template and the substrate at the central region.

Out-of-plane deformation, in particular out-of-plane deformations caused by force errors at corners of a template, when detected and analyzed by a "through the mask" (TTM) alignment system based on alignment marks in corners of the template, register as an apparent field magnification (i.e., in-plane deformation). In addition to degrading overlay, this deformation may also preclude the use of certain alignment marks for real-time adjustment of the magnification actuator, since apparent magnification due to force on the substrate by the template in the Z direction can be difficult to distinguish from in-plane magnification. In addition to imprint force, field tilt in X and Y directions can also affect overlay.

Alignment marks at different locations on an imprint field have different sensitivity to imprint force and air cavity pressure. Alignment marks in a peripheral region of a template and alignment marks in a central region of a template may be subject to in-plane alignment error of substantially the same magnitude. Alignment marks in a peripheral region of a template (e.g., in the corners of a template) may be subject to greater out-of-plane alignment error than alignment marks in a central region of a template. In some cases, alignment marks in a central region of the template are substantially free of out-of-plane alignment error. By grouping alignment marks into those subject to out-of-plane alignment error and those substantially free of out-of-plane alignment error, in-plane alignment error and its associated correction can be decoupled from out-of-plane alignment error and its associated correction in a real-time feedback process.

Imprint lithography substrates and templates may include corresponding pairs of overlay marks that allow for assessment of and compensation for overlay errors in an imprinted substrate. Overlay marks in a template are transferred to the polymeric layer during polymerization of the imprint resist, yielding an imprinted substrate with corresponding pairs of overlay marks. Overlay errors of corresponding pairs of overlay marks in an imprinted substrate may be assessed to yield in-plane and out-of-plane contributions to overlay error. The in-plane contributions, out-of-plane contributions, or both, may be compared with overlay errors associated with known orientation parameters of a template with respect to a substrate (e.g., in a lookup table). Corrected orientation parameters may be selected to reduce overlay errors in subsequent imprinted substrates. In some embodiments, this feedforward scheme based on corresponding pairs of overlay marks in an imprinted substrate may be combined with a feedback scheme based on corresponding pairs of alignment marks on a template and a substrate during an imprinting process to reduce in-plane and out-of-plane overlay errors of an imprinted substrate.

Figure 5:
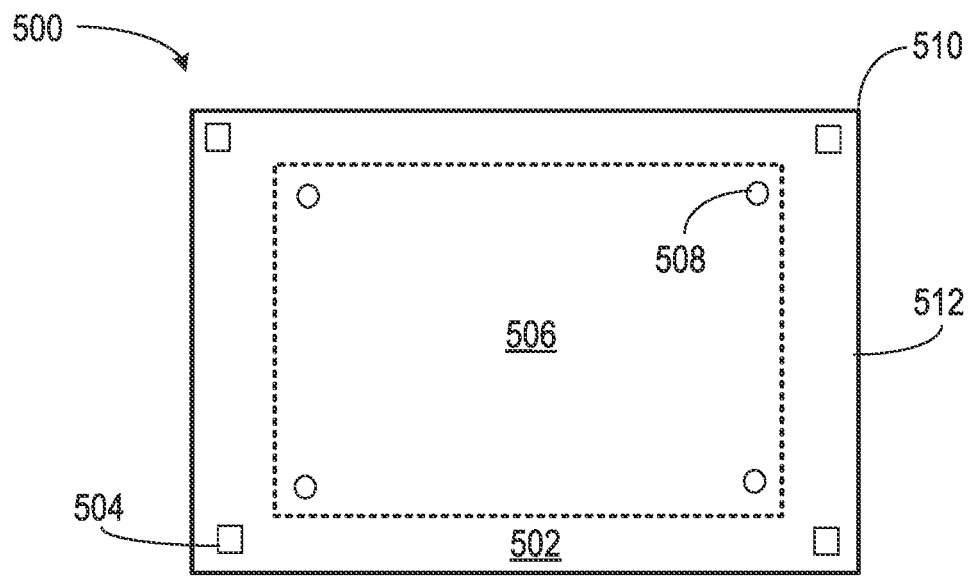
FIG. 5 depicts a top view of a nanoimprint lithography template having a central region and a peripheral region in the X-Y plane of the template.

FIG. 5 depicts nanoimprint lithography template 500 in the X-Y plane of the template. Template 500 has peripheral region 502 with peripheral marks 504 and central region 506 with central marks 508. Peripheral marks 504 and central marks 508 may be alignment marks, overlay marks (e.g., KLA Archer marks), or a combination thereof. In some examples, peripheral region 502 includes up to several millimeters (e.g., up to 2 mm or up to 4 mm) at a boundary of the imprinting portion of the template. Alignment marks typically include gratings, checker-board marks, or other appropriate indicia formed in a surface of the template, as described in U.S. Pat. No. 7,880,872, which is incorporated by reference herein. In some examples, alignment have a length or width of about 100 μm, about 50 μm, or less. Suitable overlay marks include box-inbox, cross-in-box, and grating-in-box type marks and are typically of smaller dimensions than alignment marks.

Central region 506 is typically subject to in-plane error and is typically substantially free of out-of-plane error or deformation in an imprinting process. Peripheral region 502 is typically subject to a combination of in-plane error and out-of-plane error or deformation in an imprinting process. As used herein, "combined deformation" generally refers to as a combination of in-plane error and out-of-plane error.

The number of peripheral marks 504 in peripheral region 502 of template 500 is typically four. Peripheral marks 504 may be proximate corners 510 or edges 512 of template 500. The number of central marks 508 is typically four. In some embodiments, a number of alignment marks 504 or central marks 508 is 8, 10, 12, 14, 16, 18, 20, or more. Central marks 508 may define the corners of a polygon, such a quadrilateral (e.g., a rectangle or a parallelogram). However, other symmetrical or asymmetrical placements of central marks may be implemented as appropriate. When marks 504 and 508 are overlay marks, the marks are transferred to the polymeric layer formed in an imprinting process.

Figure 6:
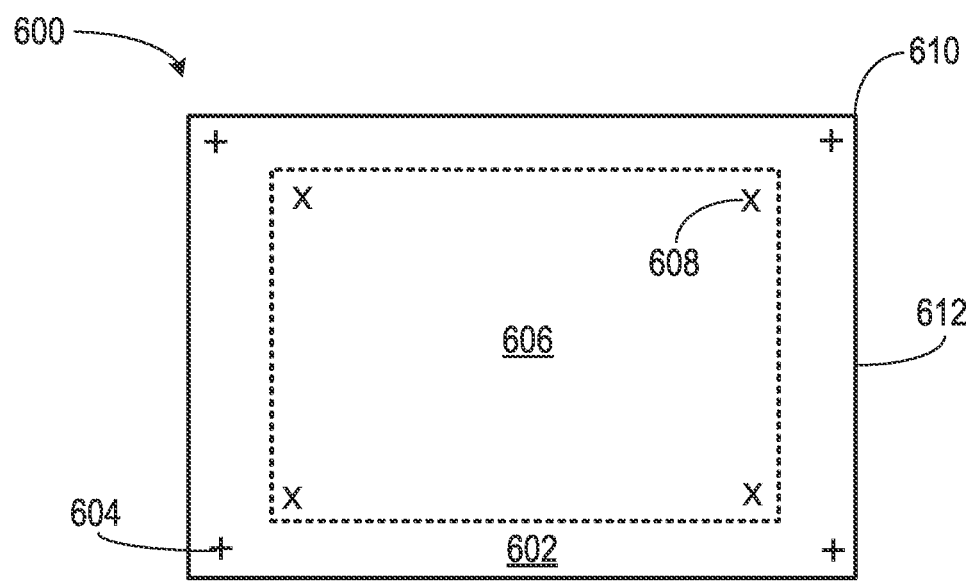
FIG. 6 depicts top view of an imprint lithography substrate (or a field of an imprint lithography substrate) having a central region and a peripheral region in the X-Y plane of the substrate.

Corresponding marks of a complementary substrate are positioned in each imprint field of a substrate, with substrate peripheral marks positioned proximate a corner or a boundary of the template imprinting area. FIG. 6 depicts an imprint field 600 of a substrate. Imprint field 600 has peripheral region 602 with peripheral marks 604 and central region 606 with central marks 608. Each peripheral mark 604 of the substrate corresponds to one of peripheral marks 504 of template 500, and each central mark 608 corresponds to one of the central marks 508 of the template. Peripheral marks 604 may be proximate corners 610 or edges 612 of substrate 600. When marks 504 and 508 are overlay marks, the marks are transferred to the polymeric layer formed in an imprinting process, and the resulting imprinted substrate includes pairs of corresponding overlay marks.

As depicted, peripheral regions 502 and 602 form a continuous border proximate edges 512 of template 500 and edges 612 of imprint field 600. The border may have a constant width or a variable width. In one example, a width of the border at the corners of the template 500 or imprint field 600 exceeds a width of the border along straight edges of the template or the imprint field. In some cases, peripheral regions 502 and 602 include multiple discontinuous regions, with each discontinuous region including a corner of the template or substrate, respectively.

Figure 7:
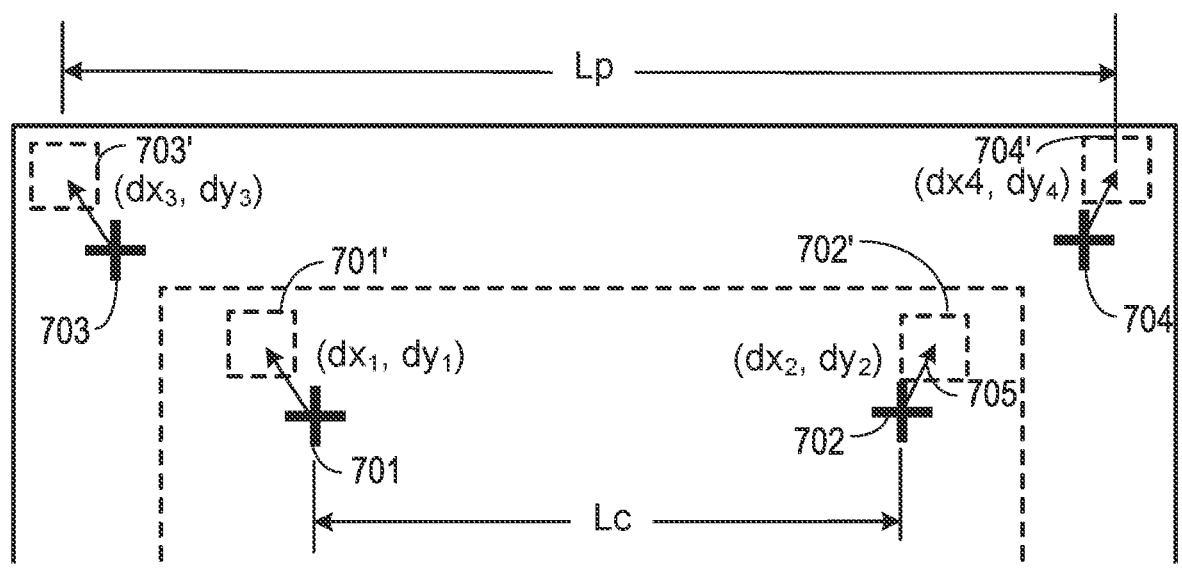
FIG. 7 depicts top views of an imprint lithography template superimposed on an imprint lithography substrate, showing alignment errors of pairs of corresponding central and peripheral alignment marks.

An in-plane alignment error of a template is assessed based on the relative positions of each central mark of the template and each corresponding central mark of the substrate when the template is superimposed over the substrate. An in-plane overlay error of an imprinted substrate is assessed based on the relative positions of each central mark of the polymeric layer and each corresponding central mark of the imprinted substrate. FIG. 7 depicts a top view of a portion of a template in superimposition with a portion of a substrate. Alternatively, FIG. 7 depicts a top view of an imprinted substrate. Central marks 701, 701' and 702, 702' and alignment marks 703, 703' and 704, 704' are visible through the template. Alignment or overlay errors between pairs of corresponding central marks and pairs of corresponding peripheral marks in the X-Y plane of the template or imprinted substrate are represented as (dxn, dyn) for the nth pair of corresponding marks. Vectors 705 indicate the direction and magnitude of the errors.

From the measured errors at the corresponding pairs of central marks, in-plane errors, including translation x and y along the X and Y axes, respectively, rotation θ in the X-Y plane about the Z axis, and magnification along the X axis and the like, can be calculated by methods known in the art.

In a similar process, a combined error (in-plane error and out-of-plane error) is assessed based on the relative positions of each peripheral mark of the template or polymeric layer and each corresponding peripheral mark of the substrate. The central region is typically free of out-of-plane error. As such, an out-of-plane error can be assessed by linearly removing the in-plane deformation from the combined error. More specifically, the in-plane errors calculated from the central marks can be subtracted from the combined error. The remaining combined error after said subtraction of in-plane errors can be fit to in-plane distortion signatures associated with the force and tilt errors to yield estimates of these our-of-plane errors.

A relative position of the template and the substrate may be adjusted in a real-time feedback mode or an offline feedforward mode to reduce the in-plane error, the out-of-plane error, or both. In one example, a relative position of the template and the substrate is adjusted in a first adjustment or series of adjustments to reduce the in-plane error, and a relative position of the template and the substrate is adjusted in a second adjustment or series of adjustments to reduce the out-of-plane error. In another example, a relative position of the template and the substrate is adjusted in a first adjustment or series of adjustments to reduce the out-of-plane error, and a relative position of the template and the substrate is adjusted in a second adjustment or series of adjustments to reduce the in-plane error. Thus, data from the central region and the peripheral region can be used as feedback or feedforward signals to independently correct in-plane and out-of-plane errors.

Figure 8A:
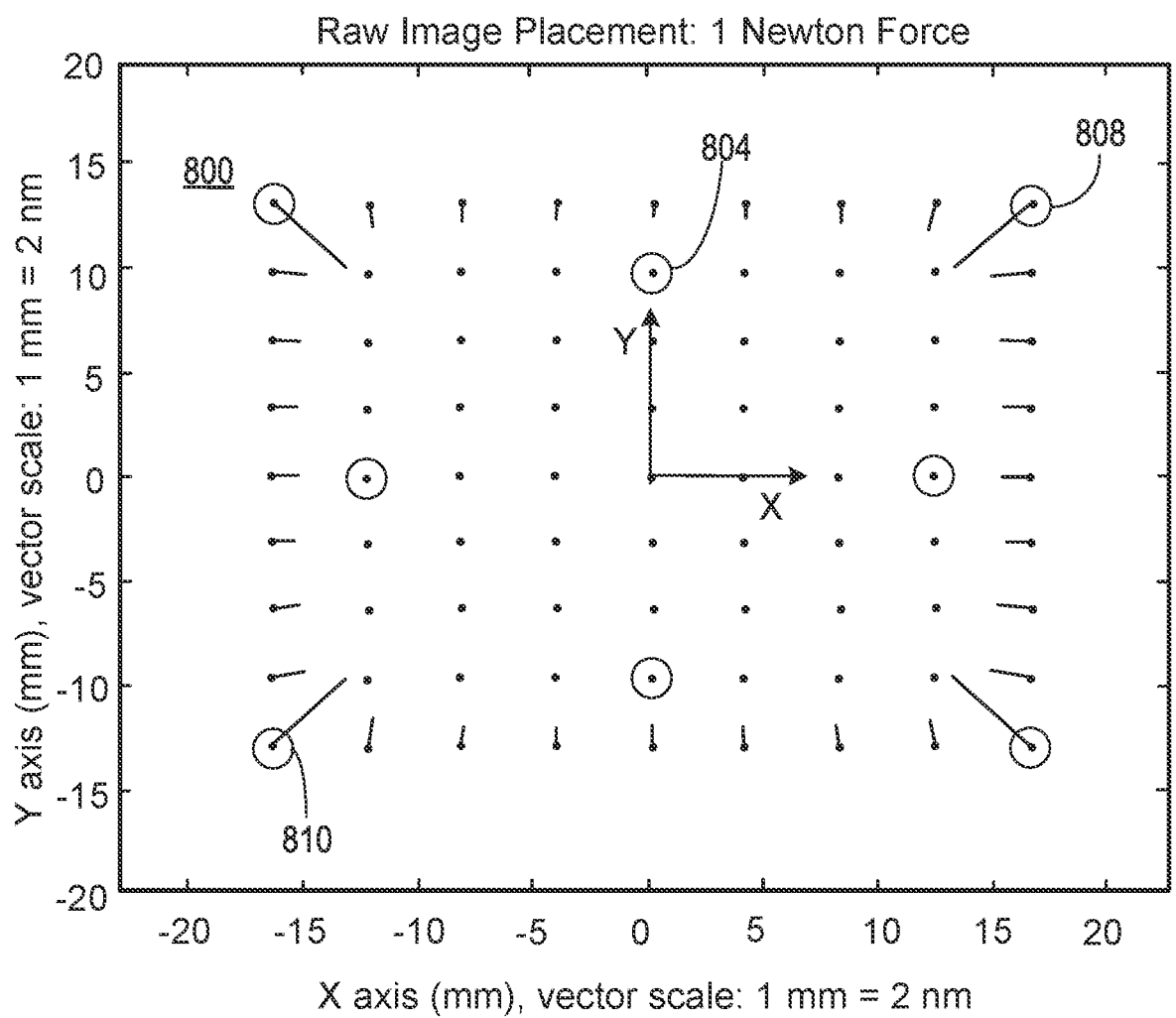
FIGS. 8A-8C depict nanoimprint lithography templates showing deformation due to force and tilt error.
Figure 8B:
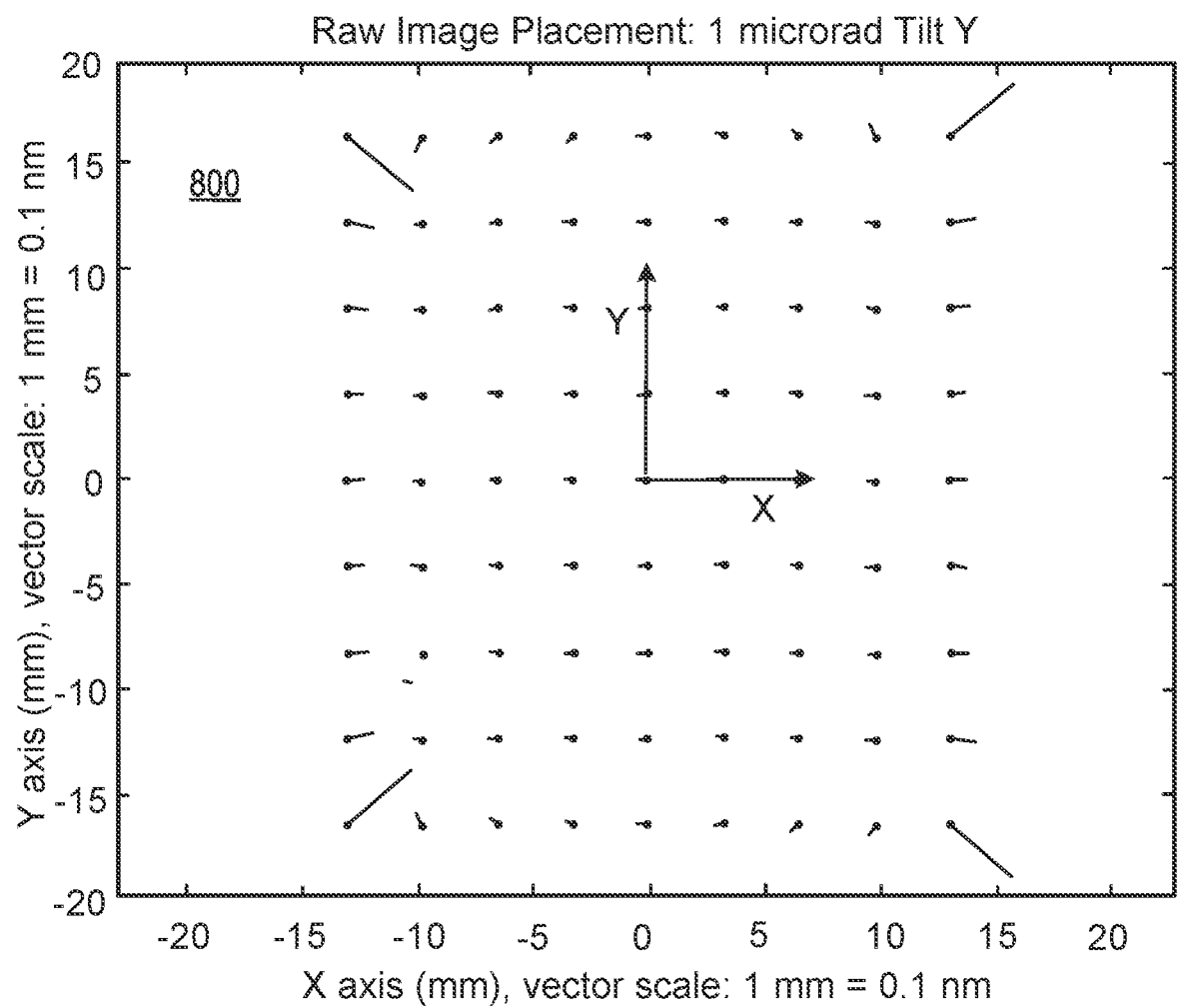
Figure 8C:
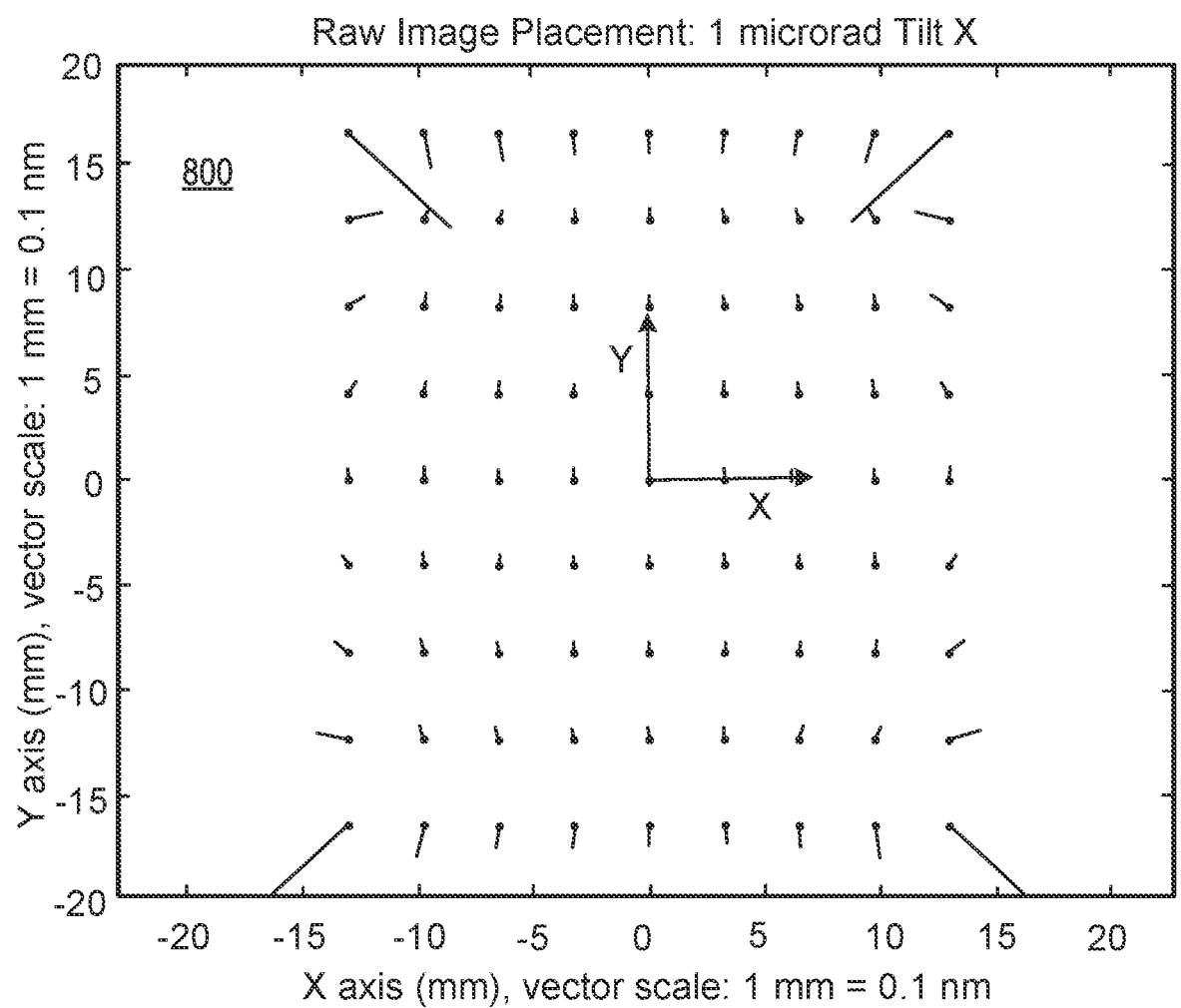

FIGS. 8A-8C depict deformations of nanoimprint lithography templates caused by imprint force, air cavity, and tilt errors estimated from simulation models (e.g., finite element analysis). FIG. 8A depicts deformations of nanoimprint lithography template 800 with central marks 804 and peripheral marks 808 due to a 1 N imprint force. Here, the template is made of 1.1 mm thick fused silica and has a field size of 26 mm by 33 mm. The 64 mm circular and 1.1 mm thick portion of the template is surrounded by ~6 mm thick semiconductor standard mask glass. The X-Y plane of template 800 is indicated, and the Z direction is orthogonal to the X-Y plane. Vectors 810 indicate a direction and magnitude of the deformation caused by the 1 N imprint force. As seen by the length of vectors 810, there is more deformation at peripheral marks 808 than central marks 804. FIG. 8B depicts deformation of nanoimprint lithography template 800 due to 1 μrad tilt (rotation) around the Y axis in the plane of the template. FIG. 8C depicts deformation of nanoimprint lithography template 800 due to 1 μrad tilt around the X axis in the plane of the template.

Figure 9:
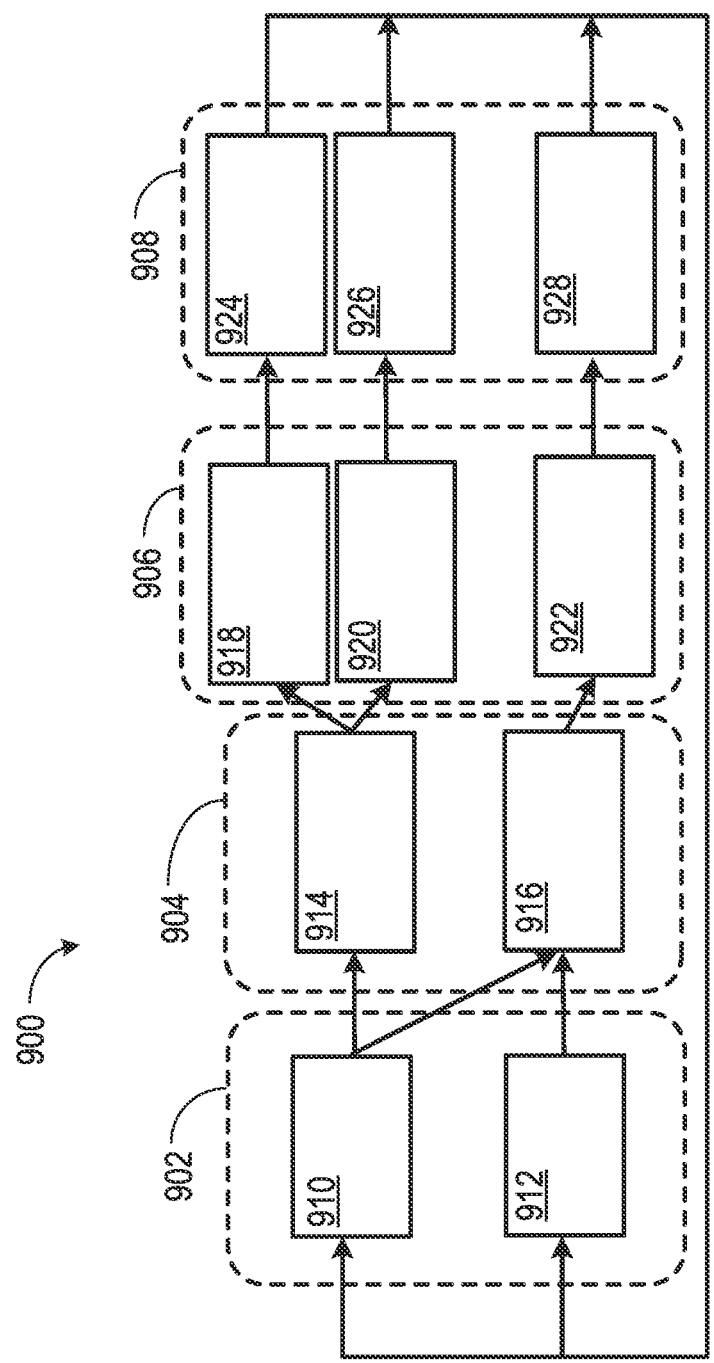
FIG. 9 depicts a system for adjusting a relative position of a nanoimprint lithography template and substrate.

FIG. 9 depicts a system 900 for adjusting a relative position of a template and a substrate based on assessed in-plane and out-of-plane deformations. In one embodiment, the system 900 includes an optical system 902 for measurement of error, error translator system 904, controller system 906, and actuator system 908. Error translator system 904 converts error measurements into control parameters for an imprint lithography system, such as that depicted in FIG. 1. Typically, the conversion is based on geometric aspects of the template and the substrate. Optical system 902 includes peripheral "through the mask" (TTM) system 910 for assessing peripheral error and central TTM system 912 for assessing central error. Error translator system 904 includes in-plane translator 914 for in-plane corrections and out-of-plane translator 916 for out of plane corrections. Controller system 906 includes stage controller 918, in-plane magnification controller 920, and imprint head controller 922. Actuator system 908 includes stage 924, magnification unit 926, and imprint head 928. Stage controller 918 controls X-Y translation or rotation in the X-Y plane of the template or the substrate via stage 924 of actuator system 908. In-plane magnification controller 920 controls compression force on the template in the X-Y plane of the template via magnification unit 926 of actuator system 908. Imprint head 928 controls out-of-plane motion of the template, including the distance between the template and the substrate and the tilt of the template with respect to the substrate. Based on errors assessed by optical system 902, and conversion of assessed error to corrective positions or movements of the template and/or substrate by error translator system 902, controller system 906 provides signals to actuator system 908 to adjust the relative positioning of the template and substrate. Correction of in-plane error includes translation of the template about orthogonal axes (X, Y) in the plane of the template, rotation (8) of the template about an axis orthogonal to the plane, or both. Correction of out-of-plane error includes translation of the template along the Z axis and rotation of the template about an axis in the plane of the template.

Alignment and overlay errors measured at peripheral marks correspond linearly to the corrections in force and tilt. Therefore, corrections for out-of-plane errors can be made without considering contributions from other mechanical sources or electric noises. This type of endpoint sensing effectively captures error sources with little or no delay, including magnification non-linearity, and reduces the need for force sensors and elaborate calibration requirements for the imprint head. Methods described herein can also be used to inform resist drop location and volume optimization to reduce residual layer thickness nonuniformity related to out-of-plane deformation of the template.

In some embodiments, controlling a tilt of an imprint head or a force applied by the imprint head is based on a detection result of marks at least in a peripheral region of the substrate and the template or in the peripheral region of the substrate and the imprinted layer. Controlling the tilt of the imprint head or the force applied by the imprint head may be based on an out-of-plane component being distinguished by performing a process to distinguish the in-plane component and the out-of-plane component with respect to the detection result of the marks in the peripheral region. The process to distinguish the in-plane component and the out-plane component may be performed with respect to the detection result of the marks in the peripheral region.

In some embodiments, controlling the movement of alignment is distinguished by performing a process to distinguish an in-plane component and an out-of-plane component with respect to a detection result of marks at least in the peripheral region of the substrate and the template or in the peripheral region of the substrate and the imprinted layer.

Figure 10A:
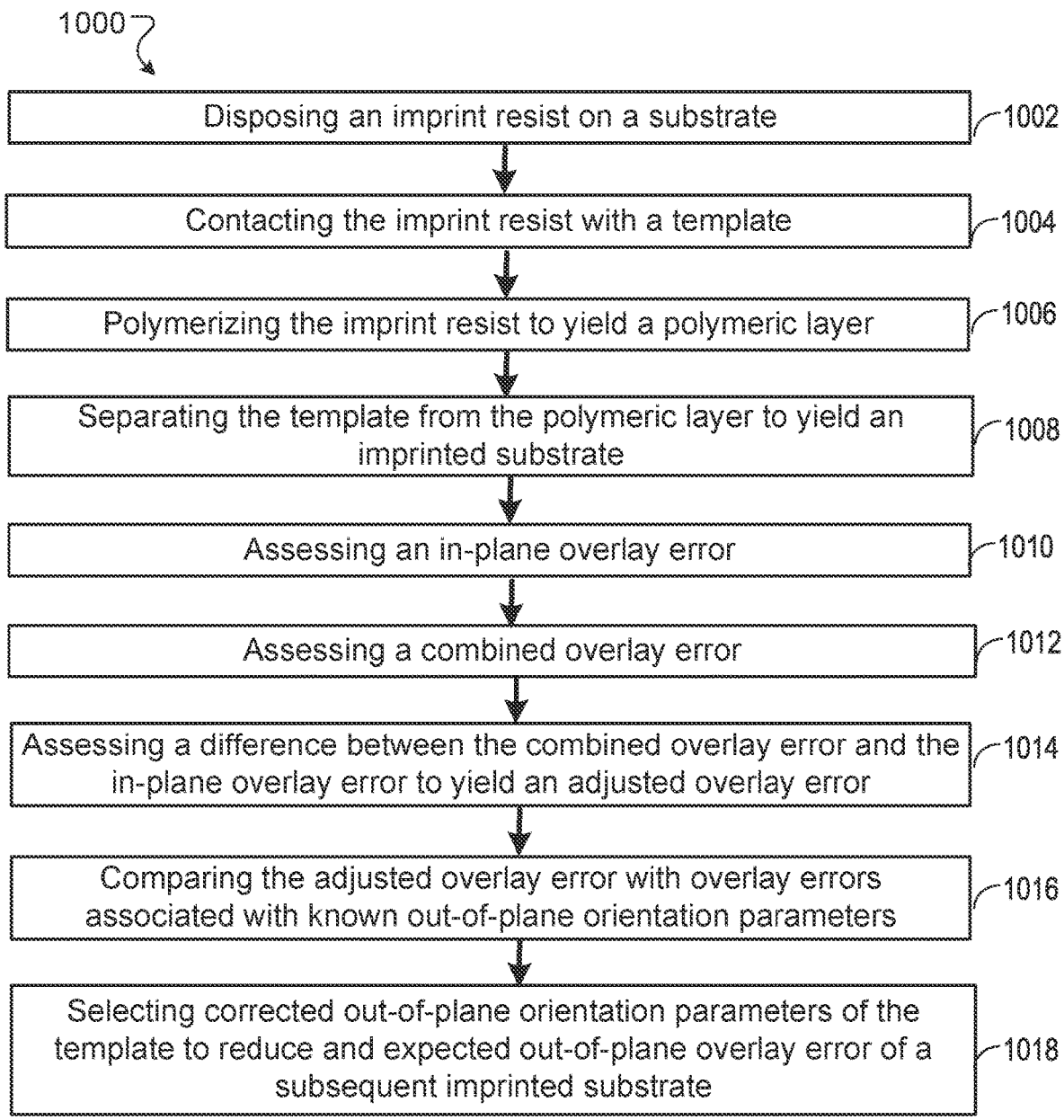
FIGS. 10A and 10B are flowcharts for processes for reducing overlay error of an imprinted substrate.

FIG. 10A is a flowchart for operations in an imprint lithography process 1000 to reduce overlay errors of an imprinted substrate. Process 1000 is illustrated as a collection of referenced acts arranged in a logical flow graph. The order in which the acts are described is not intended to be construed as a limitation, and any number of the described acts can be combined in another order or in parallel to implement the process.

In 1002, an imprint resist is disposed on a substrate. In 1004, the imprint resist is contacted with a template having initial in-plane and out-of plane orientation parameters with respect to a substrate. The template includes peripheral overlay marks in a peripheral region of the template and central overlay marks in a central region of the template. The substrate includes peripheral overlay marks that correspond to the peripheral overlay marks of the template and central overlay marks that correspond to the central overlay marks of the template. The initial out-of plane orientation parameters include an initial tilt angle of the template with respect to the substrate and an initial distance between the template and the substrate. In 1006, the imprint resist is polymerized to yield a polymeric layer in contact with the template, thereby transferring the peripheral overlay marks and the central overlay marks of the template to the polymeric layer. In 1008, the template is separated from the polymeric layer to yield an imprinted substrate. The imprinted substrate includes pairs of corresponding peripheral overlay marks on the polymeric layer and the substrate and pairs of corresponding central overlay marks on the polymeric layer and the substrate.

In 1010, an in-plane overlay error is assessed based on relative positions of each central overlay mark of the polymeric layer and each corresponding central mark of the first substrate. The in-plane overlay error may be assessed as described with respect to FIG. 7. In 1012, a combined overlay error is assessed based on relative positions of each peripheral overlay mark of the polymeric layer and each corresponding peripheral overlay mark of the substrate. The combined overlay error includes the in-plane overlay error and the out-of-plane overlay error of the imprinted substrate, and may be assessed as described with respect to FIG. 7. In 1014, a difference between the combined overlay error and the in-plane overlay error is assessed to yield an adjusted overlay error for each pair of corresponding peripheral overlay marks. The adjusted overlay error may be assessed as described with respect to FIG. 7. The adjusted overlay error for each pair of corresponding peripheral overlay marks is due at least in part to an out-of-plane distortion of the template in the peripheral region of the template during the imprinting process to form the imprinted substrate.

In 1016, the adjusted overlay error for each pair of corresponding peripheral overlay marks is compared with overlay errors associated with known out-of-plane orientation parameters of the template with respect to the substrate. In one example, the adjusted overlay error is compared to a lookup table that includes deformation signatures in the form of overlay errors caused by imprint force, air cavity, and tilt errors estimated from simulation models, such as finite element analysis. In 1018, corrected out-of-plane orientation parameters of the template with respect to the substrate are selected to reduce an expected out-of-plane overlay error of a subsequent imprinted substrate. The corrected out-of-plane orientation parameters with respect to the substrate typically include a corrected tilt angle of the template with respect to the substrate and a corrected distance between the template between the template and the substrate.

After selecting the corrected out-of-plane orientation parameters, the template may be oriented with respect to a second substrate based on the corrected out-of-plane orientation parameters. Orienting the template with respect to the second substrate may include adjusting the tilt angle of the template to the corrected tilt angle, adjusting the distance between the template and the second substrate to the corrected distance, or a combination thereof.

In some embodiments, the substrate of process 1000 (the "first" substrate) includes a multiplicity of fields (a "first" multiplicity of fields), and operations 1002-1018 are repeated for each field of the substrate to generate corrected out-of-plane orientation parameters for each field of the substrate. A second substrate may include a multiplicity of fields, each field corresponding to a field in the first multiplicity of fields. The corrected out-of-plane orientation parameters for each field of the first substrate may be applied to each corresponding field of the second substrate.

In some embodiments, process 1000 further includes comparing the overlay error for each pair of corresponding central overlay marks with overlay errors associated with known in-plane orientation parameters of the template with respect to the substrate, and selecting corrected in-plane orientation parameters of the template with respect to the first substrate to reduce an expected in-plane overlay error of a subsequent imprinted substrate. This may be achieved, for example, as described with respect to FIG. 7. The template may be oriented with respect to the subsequent substrate includes at least one of translating the template or the subsequent substrate in the plane of the template or the subsequent substrate, respectively; rotating the template or the subsequent substrate in the plane of the template or the subsequent substrate, respectively; and increasing or decreasing a compression force to opposite sides of the template.

A combination of offline feedforward overlay correction and real-time feedback correction may be suitable for processes in which there are substrate-to-substrate or field-to-field image placement variations. In some embodiments of process 1000, the template includes central alignment marks in the central region of the template and the substrate includes central alignment marks that correspond to the central alignment marks of the template.

Figure 11:
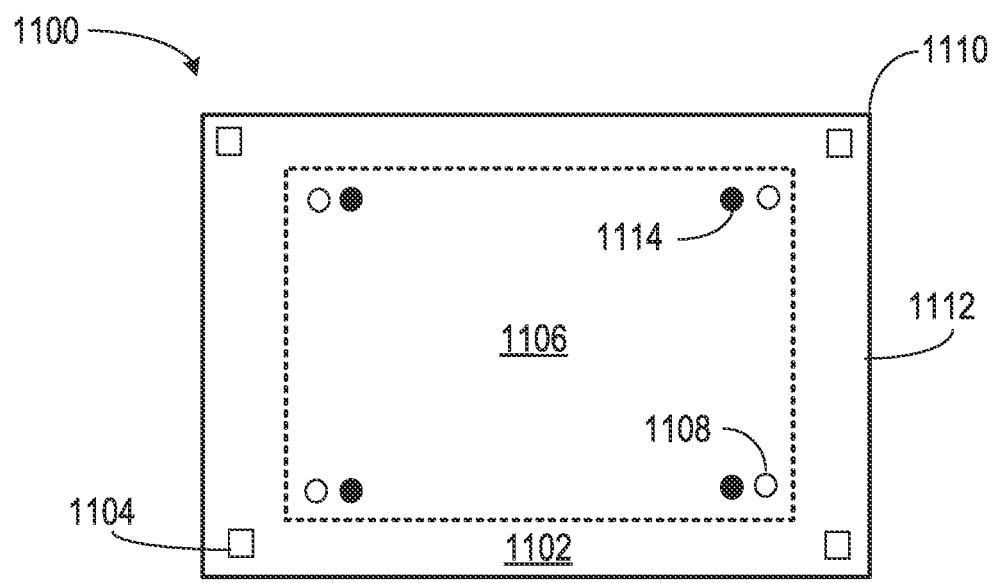
FIG. 11 depicts a nanoimprint lithography template having alignment and overlay marks.

In one example, FIG. 11 depicts lithography template 1100 in the X-Y plane of the template. Template 1100 has peripheral region 1102 with peripheral overlay marks 1104 and central region 1106 with central overlay marks 1108 and central alignment marks 1114. Central alignment marks 1114 are proximate central overlay marks 1108. Central overlay marks may define the corners of a polygon (e.g., a rectangle or a parallelogram). Peripheral overlay marks 1104 may be positioned proximate corners 1110 of template 1100 or a boundary of template imprinting boundary 1112. In some cases, central alignment marks 1114 may define corners of a quadrilateral (e.g., a rectangle or a parallelogram).

After contacting the imprint resist with the template (1004) and before polymerizing the imprint resist (1006), process 1000 includes locating each central alignment mark of the template with respect to each corresponding central alignment marks of the substrate, assessing an in-plane alignment error of the template based on relative positions of each central alignment mark of the template and each corresponding central alignment mark of the substrate, and adjusting a relative position of the template and the first substrate to reduce the in-plane alignment error of the template. Adjusting the relative position of the template and the substrate includes at least one of translating the template or the substrate in the plane of the template or the substrate, respectively; rotating the template or the substrate in the plane of the template or the substrate, respectively; and increasing or decreasing a compression force to opposite sides of the template. Thus, this embodiment includes a real-time feedback component to correct in-plane errors, and an offline feedforward component to correct out-of-plane errors.

Figure 10B:
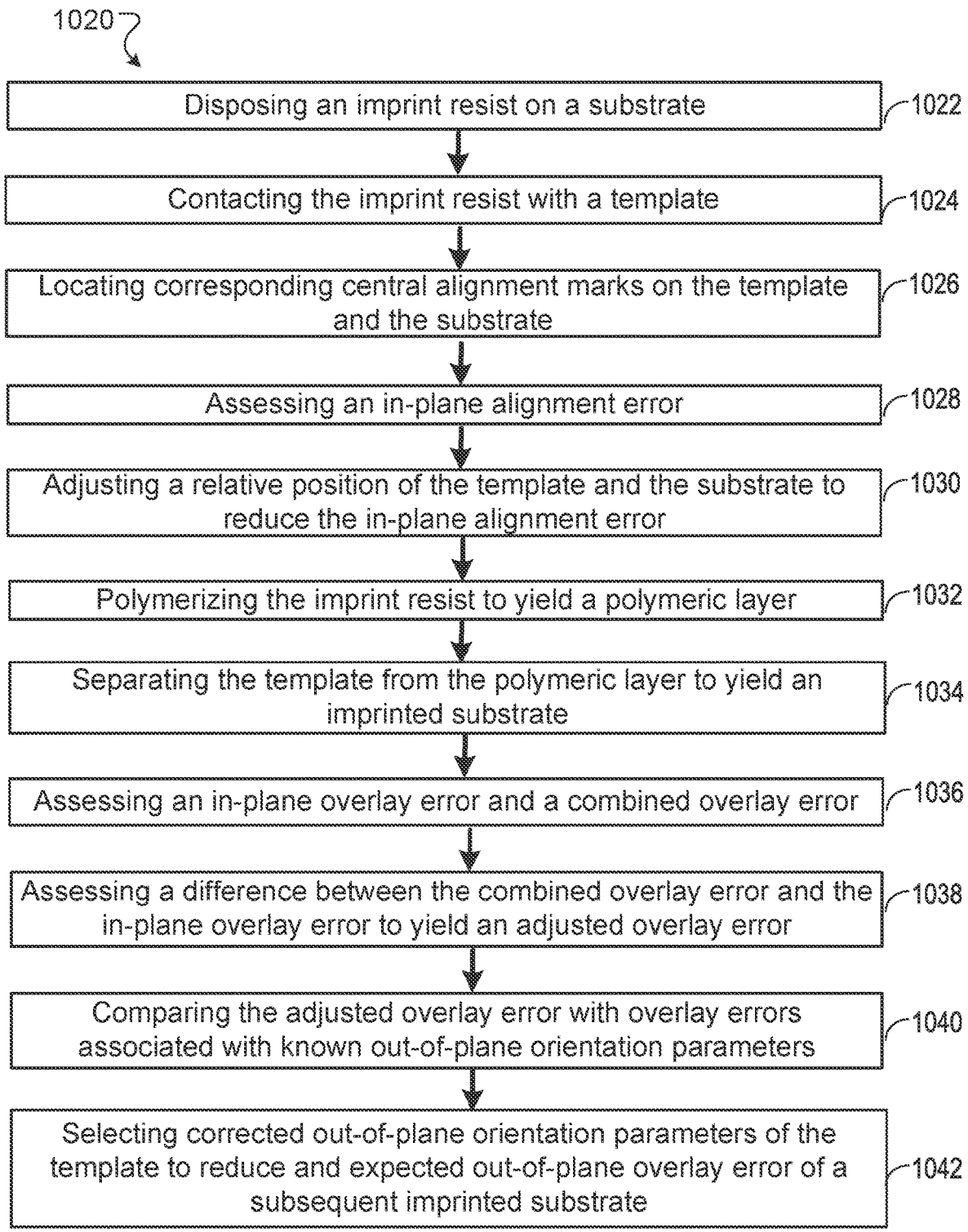

FIG. 10B is a flowchart for operations in an imprint lithography process 1020 including feedback and feedforward components to reduce overlay errors of an imprinted substrate. Process 1020 is illustrated as a collection of referenced acts arranged in a logical flow graph. The order in which the acts are described is not intended to be construed as a limitation, and any number of the described acts can be combined in another order or in parallel to implement the process.

In 1022, an imprint resist is disposed on a substrate. In 1024, the imprint resist is contacted with a template having initial in-plane and out-of plane orientation parameters with respect to a substrate. The template includes peripheral overlay marks in a peripheral region of the template and central overlay marks in a central region of the template. The substrate includes peripheral overlay marks that correspond to the peripheral overlay marks of the template and central overlay marks that correspond to the central overlay marks of the template. The initial out-of plane orientation parameters include an initial tilt angle of the template with respect to the substrate and an initial distance between the template and the substrate.

In 1026, corresponding central alignment marks are located on the template and the substrate. That is, each central alignment mark of the template is located with respect to each corresponding central alignment mark of the substrate. Alignment marks may be located by a process similar to or the same as that described for locating overlay marks. In 1028, an in-plane alignment error is assessed based on relative positions of each central alignment mark of the template and each corresponding central alignment mark of the substrate. Alignment error may be assessed by a process similar to or the same as that described for locating overlay marks. In 1030, a relative position of the template and the substrate is adjusted to reduce the in-plane alignment error in a real-time feedback process.

In 1032, the imprint resist is polymerized to yield a polymeric layer in contact with the template, thereby transferring the peripheral overlay marks and the central overlay marks of the template to the polymeric layer. In 1034, the template is separated from the polymeric layer to yield an imprinted substrate. The imprinted substrate includes pairs of corresponding peripheral overlay marks on the polymeric layer and the substrate and pairs of corresponding central overlay marks on the polymeric layer and the substrate.

In 1036, an in-plane overlay error and a combined overlay error are assessed. The in-plane overlay error is assessed based on relative positions of each central overlay mark of the polymeric layer and each corresponding central mark of the first substrate. The in-plane overlay error may be assessed as described with respect to FIG. 7. The combined overlay error is assessed based on relative positions of each peripheral overlay mark of the polymeric layer and each corresponding peripheral overlay mark of the substrate. The combined overlay error includes the in-plane overlay error and the out-of-plane overlay error of the imprinted substrate, and may be assessed as described with respect to FIG. 7. In 1038, a difference between the combined overlay error and the in-plane overlay error is assessed to yield an adjusted overlay error for each pair of corresponding peripheral overlay marks. The adjusted overlay error may be assessed as described with respect to FIG. 7. The adjusted overlay error for each pair of corresponding peripheral overlay marks is due at least in part to an out-of-plane distortion of the template in the peripheral region of the template during the imprinting process to form the imprinted substrate.

In 1040, the adjusted overlay error for each pair of corresponding peripheral overlay marks is compared with overlay errors associated with known out-of-plane orientation parameters of the template with respect to the substrate. In one example, the adjusted overlay error is compared to a lookup table that includes deformation signatures in the form of overlay errors caused by imprint force, air cavity, and tilt errors estimated from simulation models, such as finite element analysis. In 1042, corrected out-of-plane orientation parameters of the template with respect to the substrate are selected to reduce an expected out-of-plane overlay error of a subsequent imprinted substrate. The corrected out-of-plane orientation parameters with respect to the substrate typically include a corrected tilt angle of the template with respect to the substrate and a corrected distance between the template between the template and the substrate.

After selecting the corrected out-of-plane orientation parameters, the template may be oriented with respect to a second substrate based on the corrected out-of-plane orientation parameters. Orienting the template with respect to the second substrate may include adjusting the tilt angle of the template to the corrected tilt angle, adjusting the distance between the template and the second substrate to the corrected distance, or a combination thereof.

An imprint lithography method of manufacturing an article includes operations 1002 through 1018 of process 1000 or operations 1022 through 1042 of process 1020, followed by orienting the template with respect to a second substrate based on the corrected out-of-plane orientation parameters, and forming a subsequent imprinted substrate to yield the article. Orienting the template with respect to the subsequent substrate typically includes at least one of adjusting the tilt angle of the template to the corrected tilt angle and adjusting the distance between the template and the subsequent substrate to the corrected distance. In some examples, the article is a processed substrate or an optical component.

Referring to FIGS. 1 and 9, an imprint lithography system for reducing an overlay error of an imprinted substrate includes a template chuck 128 configured to retain a template, a substrate chuck 104 configured to retain a substrate, an imprint head 130 configured to adjust a position of the template chuck relative to a position of the substrate chuck, and a controller 144 in communication with the imprint head. The controller is configured to assess an in-plane overlay error of an imprinted substrate based on relative positions of corresponding central overlay marks in a central region of the imprinted substrate, assess a combined overlay error of the imprinted substrate based on relative positions of corresponding peripheral overlay marks in a peripheral region of the imprinted substrate, and assess a difference between the combined overlay error and the in-plane overlay error to yield an adjusted overlay error for each pair of corresponding peripheral overlay marks. The adjusted overlay error for each pair of corresponding peripheral overlay marks is due at least in part to an out-of-plane alignment error in the peripheral region of the template. The controller is also configured to compare the adjusted overlay error for each pair of corresponding peripheral overlay marks with overlay errors associated with known out-of-plane orientation parameters of the template with respect to the substrate and select corrected out-of-plane orientation parameters of the template with respect to the substrate to reduce an expected overlay error of a second imprinted substrate. The corrected out-of-plane orientation parameters include a corrected tilt angle of the template with respect to the substrate and a corrected distance between the template and the substrate. The controller is also configured to provide a signal to the imprint head to adjust an orientation of a template in the template chuck relative to an orientation of a substrate in the substrate chuck to implement the corrected out-of-plane orientation parameters.

In some embodiments, the controller is configured to provide the signal to the imprint head to tilt the template about an axis in the plane of the template and to provide the signal to the imprint head to increase or decrease a distance between the substrate and the template. The controller may also be configured to compare an overlay error for pairs of corresponding central overlay marks with overlay errors associated with known in-plane orientation parameters of the template with respect to the substrate and to select corrected in-plane orientation parameters of the template with respect to the first substrate to reduce an expected in-plane overlay error of a subsequent imprinted substrate. The controller may also be configured to orient the template with respect to the second substrate based on the corrected in-plane orientation parameters.

In a combination feedback and feedforward scheme, the controller is configured to locate central alignment marks in a central region of the template and corresponding central alignment marks in a central region of the substrate, assess an in-plane alignment error of the template based on relative positions of corresponding central alignment marks, and adjust a relative position of the template and the substrate to reduce an in-plane alignment error of the template.

A number of embodiments have been described. Nevertheless, it will be understood that various modifications may be made without departing from the spirit and scope of the disclosure. Accordingly, other embodiments are within the scope of the following claims.

What is claimed is:

1. An imprint lithography method, the method comprising:
   detecting marks in a peripheral region of a substrate and a template or in a peripheral region of the substrate and an imprinted layer on the substrate, and marks in a central region of the substrate and the template or in a central region of the substrate and the imprinted layer,
   wherein the peripheral region of the template is a region including a predetermined distance from a boundary of an imprinting portion of the template, and the central region of the template is a region inside the peripheral region of the template, and
   wherein each of the peripheral region and the central region of the substrate and each of the peripheral region and the central region of the imprinted layer are corresponding to each of the peripheral region and the central region of the template;
   performing a process to distinguish an in-plane component and an out-of-plane component based on a detection result of the marks in the peripheral region and a detection result of the marks in the central region; and
   controlling a tilt of an imprint head or a force applied by the imprint head based on the distinguished out-of-plane component.

2. A method of manufacturing an article, the method comprising:
   contacting the resist on a substrate with a template using the imprint lithography method according to the claim 1;
   polymerizing the resist to yield a polymeric layer in contact with the template;
   separating the template from the polymeric layer; and
   forming an imprinted substrate to yield the article.

* * * * *